(12) United States Patent
Mun et al.

(10) Patent No.: US 11,646,086 B2
(45) Date of Patent: May 9, 2023

(54) MEMORY DEVICE AND OPERATING METHOD THEREOF

(71) Applicant: SK hynix Inc., Gyeonggi-do (KR)

(72) Inventors: Yeong Jo Mun, Gyeonggi-do (KR); Nam Kyeong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/392,025

(22) Filed: Aug. 2, 2021

(65) Prior Publication Data

US 2022/0284970 A1  Sep. 8, 2022

(30) Foreign Application Priority Data

Mar. 8, 2021 (KR) .................. 10-2021-0030290

(51) Int. Cl.
| | |
|---|---|
| *G11C 16/16* | (2006.01) |
| *G11C 16/34* | (2006.01) |
| *G11C 16/08* | (2006.01) |
| *G11C 16/30* | (2006.01) |
| *G11C 16/28* | (2006.01) |
| *G11C 16/32* | (2006.01) |
| *G11C 16/04* | (2006.01) |

(52) U.S. Cl.
CPC ...... *G11C 16/3445* (2013.01); *G11C 16/0433* (2013.01); *G11C 16/08* (2013.01); *G11C 16/16* (2013.01); *G11C 16/28* (2013.01); *G11C 16/30* (2013.01); *G11C 16/32* (2013.01)

(58) Field of Classification Search
CPC . G11C 16/3445; G11C 16/0433; G11C 16/08; G11C 16/16; G11C 16/28; G11C 16/30; G11C 16/32
See application file for complete search history.

(56) References Cited

U.S. PATENT DOCUMENTS

| | | | |
|---|---|---|---|
| 2014/0043916 A1* | 2/2014 | Costa .................. | H01L 29/7926 365/185.25 |
| 2017/0125109 A1* | 5/2017 | Park .................. | H01L 27/11556 |
| 2017/0140829 A1* | 5/2017 | Park ...................... | G11C 16/20 |

FOREIGN PATENT DOCUMENTS

| | | |
|---|---|---|
| KR | 10-0454117 B1 | 10/2004 |
| KR | 10-2010-0010692 A | 2/2010 |

* cited by examiner

*Primary Examiner* — Jay W. Radke
(74) *Attorney, Agent, or Firm* — IP & T Group LLP

(57) ABSTRACT

A memory device comprising: a plurality of memory blocks each including a plurality of word lines arranged between a first and second select line, a peripheral circuit performs an erase operation by applying an erase voltage to a source or drain line of a selected memory block, and a control logic controls, in a period in which the erase operation is performed, the peripheral circuit to: sequentially select the plurality of word lines included in the selected memory block at least one by one from a word line closest to the first and second select line to a word line farthest from the first and second select line, apply a first erase permission voltage to the selected word lines, and apply a second erase permission voltage, which have a higher potential level than the first erase permission voltage, to remaining word lines except the selected word lines.

15 Claims, 10 Drawing Sheets

MEMORY DEVICE AND OPERATING METHOD THEREOF

CROSS-REFERENCE TO RELATED APPLICATION

This application claims priority under 35 U.S.C. § 119 to Korean Patent Application No. 10-2021-0030290 filed on Mar. 8, 2021, which is incorporated herein by reference in its entirety.

BACKGROUND

1. Field

Various embodiments relate to a semiconductor design technology, and more particularly, to a memory device capable of efficiently performing a GIDL (Gate Induced Drain Leakage)-based erase operation, and an operating method thereof.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted.

Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

SUMMARY

Various embodiments of the present disclosure are directed to a memory device capable of efficiently performing a GIDL (Gate Induced Drain Leakage)-based erase operation, and an operating method thereof.

The technical problems to be solved by the present disclosure are not limited to those mentioned above, and the other technical problems which are not mentioned can be clearly understood by a person skilled in the art, to which the present disclosure pertains, from the following descriptions.

In accordance with an embodiment of the present invention, a memory device may include: a memory cell array comprising a plurality of memory blocks each including a plurality of memory cells and a plurality of word lines arranged between a first select line and a second select line; a peripheral circuit suitable for performing an erase operation by applying an erase voltage to a source line or a drain line of a memory block selected among the plurality of memory blocks and then by floating the first and second select lines to precharge a channel of a cell string within the selected memory block; and a control circuit suitable for controlling, in a period in which the erase operation is performed, the peripheral circuit to: sequentially select one of the plurality of word lines from a word line closest to the first select line to a word line farthest from the first and second select lines, concurrently select one of the plurality of word lines from a word line closest to the second select line to the word line farthest from the first and second select lines, and apply a first erase permission voltage to the selected word lines while applying a second erase permission voltage to remaining word lines except the selected word lines among the plurality of word lines. The first erase permission voltage may have a lower potential level than the second erase permission voltage.

The control circuit may control the peripheral circuit further to apply, after the sequentially selecting, the concurrently selecting and the applying for all of the plurality of word lines as the selected word lines, the second erase permission voltage to all of the word lines until the period ends.

The control circuit may control the peripheral circuit further to repeat the sequentially selecting, the concurrently selecting and the applying until the period ends.

The second erase permission voltage may have a ground voltage level and the first erase permission voltage may have a negative level lower than the ground voltage level.

The plurality of word lines may include a first dummy word line closest to the first select line, a second dummy word line closest to the second select line and a third dummy word line farthest from the first and second select lines.

The peripheral circuit may include: a source line driver suitable for applying the erase voltage to the source line; a page buffer group suitable for controlling the bit lines of the selected memory block to be floated in the period; and a row decoder suitable for floating the first and second select lines and applying the first and second erase permission voltages, in the period.

The control circuit may control the peripheral circuit further to perform an erase verify operation after the period, to increase, when a result of the erase verify operation indicates fail of the erase operation, a potential level of the erase voltage according to an Increment Step Pulse Erase (ISPE) scheme, and to perform the erase operation again with the increased erase voltage.

In accordance with an embodiment of the present invention, a memory device may include: a memory cell array comprising a plurality of memory blocks each including a plurality of memory cells and a plurality of word lines arranged between a first select line and a second select line; and a peripheral circuit suitable for performing an erase operation by applying an erase voltage to a source line or a drain line of a memory block selected among the plurality of memory blocks. In a period in which the erase operation is performed, the peripheral circuit may be further suitable for: sequentially selecting the plurality of word lines included in the selected memory block at least one by one from a word line closest to the first select line and the second select line to a word line farthest from the first select line and the second select line, applying a first erase permission voltage to the selected word lines, and applying a second erase permission voltage to remaining word lines except the selected word lines. The first erase permission voltage may have a lower potential level than the second erase permission voltage.

The peripheral circuit may be further suitable for applying, after the sequentially selecting and the applying of the first erase permission voltage to all of the word lines, the second erase permission voltage to all of the word lines until the period for a predetermined time is ended.

The peripheral circuit may be further suitable for repeating the sequentially selecting, the applying of the first permission voltage and the applying of the second permission voltage until the period for a predetermined time is ended.

The second erase permission voltage may have a ground voltage level, and the first erase permission voltage may have a negative level lower than the ground voltage level.

The plurality of word lines may include a first dummy word line closest to the first select line, a second dummy word line closest to the second select line and a third dummy word line farthest from the first select line and the second select line.

The peripheral circuit may include: a source line driver suitable for applying the erase voltage to the source line; a page buffer group coupled to bit lines of each of the memory blocks, and suitable for controlling the bit lines of the selected memory block to be floated in the period; and a row decoder coupled to local lines of the plurality of memory blocks, and suitable for floating the first select line and the second select line among the local lines of the selected memory block, applying the first erase permission voltage to the selected word lines, and applying the second erase permission voltage to the remaining word lines, in the period.

In accordance with an embodiment of the present invention, an operating method of a memory device which includes a memory cell array including a plurality of memory blocks each having a plurality of memory cells and a plurality of word lines arranged between a first select line and a second select line, the operating method may include an erase step of performing an erase operation during a period by applying an erase voltage to a source line or a drain line of a memory block selected among the plurality of memory blocks and then by floating the first and second select lines to precharge a channel of a cell string within the selected memory block. The erase step may include: sequentially selecting one of the plurality of word lines from a word line closest to the first select line to a word line farthest from the first and second select lines; concurrently selecting one of the plurality of word lines from a word line closest to the second select line to the word line farthest from the first and second select lines; and applying a first erase permission voltage to the selected word lines while applying a second erase permission voltage to remaining word lines except the selected word lines among the plurality of word lines. The first erase permission voltage may have a lower potential level than the second erase permission voltage.

The operating method may further include applying, after the sequentially selecting, the concurrently selecting and the applying for all of the plurality word lines as the selected word lines, the second erase permission voltage to all of the word lines until the period ends.

The operating method may further include repeating the sequentially selecting, the concurrently selecting and the applying until the period ends.

The second erase permission voltage may have a ground voltage level and the first erase permission voltage may have a negative level lower than the ground voltage level.

The plurality of word lines may include a first dummy word line closest to the first select line, a second dummy word line closest to the second select line and a third dummy word line farthest from the first and second select lines.

In accordance with an embodiment of the present invention, a method of erasing a nonvolatile memory block coupled to a source line, first and second select lines and word lines arranged between the first and second select lines, the method may include: applying an erase voltage to the source line and then floating the first and second select lines to precharge a channel of a cell string within the block; performing sequential iterations to erase the block; and verifying whether the erasing of the block is of success. The sequential iterations may include applying a first erase permission voltage to the individual word lines sequentially from an outermost word line to an innermost word line with respect to the first and second select lines while applying to remaining ones of the word lines a second erase permission voltage higher than the first erase permission voltage.

The method may further include applying, between the performing and the verifying, the second erase permission voltage to the word lines.

The method may further include repeating, when the erasing of the block is verified as failed, the applying, the performing and the verifying by raising the erase voltage.

In accordance with the embodiments of the present invention, the memory device which uses a GIDL-based erase operation may apply two types of erase permission voltages having different potential levels to a plurality of word lines included in an erase target memory block during an erase operation period.

In particular, during the erase operation period, the memory device may sequentially select the plurality of word lines included in erase target memory block from a word line located at the edge of the memory block to a word line located in the center of the memory block at least one by one, and apply a negative voltage to the selected word lines.

Through this operation, the memory device may significantly increase hole mobility corresponding to the voltage level of the erase voltage while the GIDL-based erase operation is performed. Therefore, it is possible to minimize the time required for the erase operation, and to reduce erase stress applied to the erase target memory block. Furthermore, it is possible to minimize the number of times that the potential level of the erase voltage is increased according to an ISPE (Increment Step Pulse Erase) method. Moreover, it is possible to reduce power consumption required for generating an erase voltage with a high potential level.

DETAILED DESCRIPTION

Figure 1:
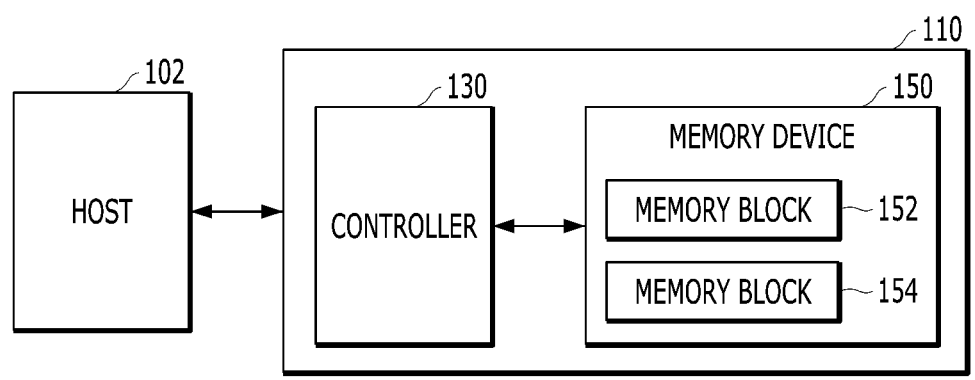
FIG. 1 is a diagram for describing an example of a memory system in accordance with an embodiment of the present invention.

Various examples of the present disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the present disclosure. It will be further understood that terms, such as those defined in commonly used dictionaries, should be interpreted as having a meaning that is consistent with their meaning in the context of the present disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the present disclosure are described in detail below with reference to the accompanying drawings, wherein like numbers reference like elements.

FIG. 1 is a diagram for describing an example of a memory system in accordance with an embodiment of the present invention.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data to be accessed by the host 102. The controller 130 may control an operation of storing data in the memory device 150.

The controller 130 and the memory device 150 in included the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation.

Figure 2:
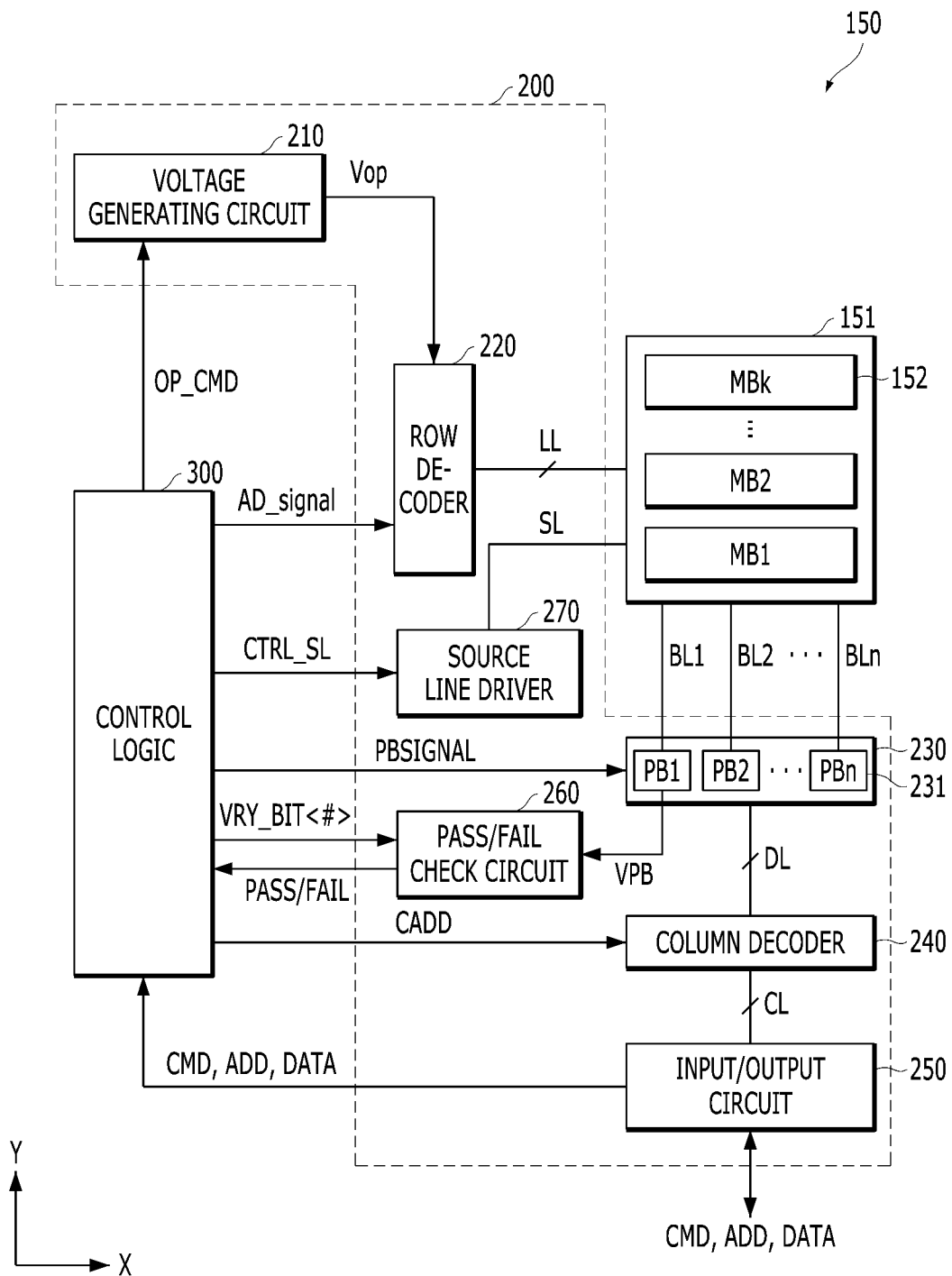
FIG. 2 is a diagram for describing an example of a memory device illustrated in FIG. 1, in accordance with an embodiment of the present invention.

FIG. 2 is a diagram for describing an example of the memory device illustrated in FIG. 1, in accordance with an embodiment of the present invention.

Referring to FIG. 2, the memory device 150 may include a memory cell array 151 in which data are stored. The memory device 150 may include a peripheral circuit 200 configured to perform a program operation for storing data in the memory cell array 151, a read operation for outputting stored data, and an erase operation for easing stored data. The memory device 150 may include a control logic 300 configured to control the peripheral circuit 200 under control of the memory controller (130 of FIG. 1).

The memory cell array 151 may include a plurality of memory blocks 152 where k is a positive integer. Local lines LL and bit lines BL1 to BLn may be coupled to each of the memory blocks 152, where n is a positive integer. For example, the local lines LL may include a first select line, a second select line and a plurality of word lines arranged between the first and second select lines. The local lines LL may further include a dummy line arranged between the first select line and a word line, a dummy line arranged between the second select line and a word line, and a dummy line arranged between the word lines. The first select line may be a source select line, and the second select line may be a drain select line. For example, the local lines LL may include the word lines, the drain and source select lines, and a source line SL. For example, the local lines LL may further include the dummy lines. For example, the local lines LL may further include a pipe line. The local lines LL may be coupled to each of the memory blocks 152, and the bit lines BL1 to BLn may be coupled to the memory blocks 152 in common. The memory blocks 152 may be implemented with a 2D or 3D structure. For example, each of the memory blocks 152 with a 2D structure may include memory cells arranged in a direction parallel to a substrate. For example, each of the memory blocks 152 with a 3D structure may include memory cells stacked in a direction perpendicular to the substrate.

The peripheral circuit 200 may be configured to perform program, read and erase operations on a memory block selected among the memory blocks 152, under control of the control logic 300. For example, the peripheral circuit 200 may include a voltage generating circuit 210, a row decoder 220, a page buffer group 230, a column decoder 240, an input/output circuit 250, a pass/fail check circuit 260 and a source line driver 270.

The voltage generating circuit 210 may generate various operating voltages Vop, used for the program, read and erase operations, in response to an operating signal OP_CMD. Furthermore, the voltage generating circuit 210 may selectively discharge the local lines LL in response to the operating signal OP_CMD. For example, the voltage generating circuit 210 may generate a program voltage, a verify voltage, a pass voltage, an erase voltage and a select transistor operating voltage under control of the control logic 300.

The row decoder 220 may transfer the operating voltage Vop to the local lines LL coupled to the selected memory blocks 152 in response to a row decoder control signal AD_signal. For example, the row decoder 220 may selectively apply the operating voltage (for example, the program voltage, the verify voltage, the pass voltage or the like), generated by the voltage generating circuit 210, to the local lines LL or float some lines (for example, the word lines and the source select line) of the local lines LL, in response to the row decoder control signal AD_signal.

The page buffer group 230 may include a plurality of page buffers PB1 to PBn (231) coupled to the bit lines BL1 to BLn, respectively. The page buffers PB1 to PBn (231) may operate in response to a page buffer control signal PBSIGNAL. For example, the page buffers PB1 to PBn (231) may control the bit lines BL1 to BLn to be floated during an erase voltage applying operation of the erase operation, and sense the currents or voltage levels of the bit lines BL1 to BLn during an erase verify operation of the erase operation.

The column decoder 240 may transfer data between the input/output circuit 250 and the page buffer group 230 in response to a column address CADD. For example, the column decoder 240 may exchange data with the page buffer 231 through a data line DL, or exchange data with the input/output circuit 250 through a column line CL.

The input/output circuit 250 may transfer a command CMD and address ADD, received from the memory controller 130 of FIG. 1, to the control logic 300 or exchange data DATA with the column decoder 240.

The pass/fail check circuit 260 may generate a reference current in response to a permission bit VRY_BIT<#>, and output a pass signal PASS or fail signal FAIL by comparing a sensing voltage VPB received from the page buffer group 230 to a reference voltage generated through the reference current, during a read operation or verify operation.

The source line driver 270 may be coupled to a memory cell included in the memory cell array 151 through the source line SL, and control a voltage applied to the source line SL. For example, the source line driver 270 may generate an erase voltage and apply the erase voltage to the source line, during the erase operation.

The source line driver 270 may receive a source line control signal CTRL_SL from the control logic 300, and control a source line voltage applied to the source line SL based on the source line control signal CTRL_SL.

The control logic 300 may output the operating signal OP_CMD, the row decoder control signal AD_signal, the page buffer control signal PBSIGNAL and the permission bit VRY_BIT<#> in response to the command CMD and the address ADD, and control the peripheral circuit 200. The control logic 300 may check whether the verify operation passed or failed, in response to the pass or fail signal PASS or FAIL.

Figure 3:
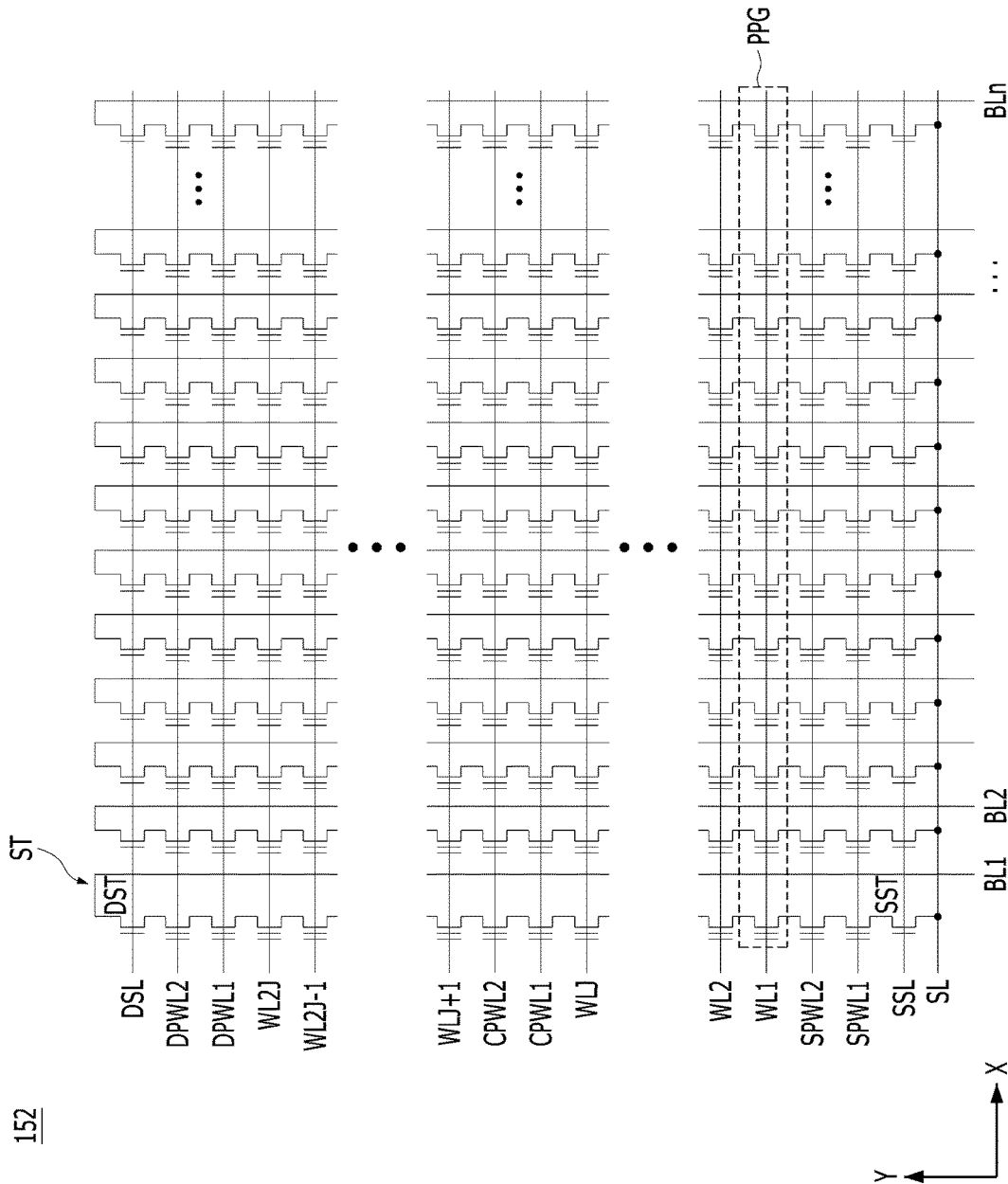
FIG. 3 is a diagram for describing an example of a memory block illustrated in FIG. 2, in accordance with an embodiment of the present invention.

FIG. 3 is a diagram for describing an example of the memory block illustrated in FIG. 2, in accordance with an embodiment of the present invention.

FIG. 3 illustrates an example of the case in which the memory block illustrated in FIG. 2 is configured in a 2D manner.

Specifically, the memory block 152 may include a plurality of word lines SPWL<1:2>, WL<1:J>, CPWL<1:2>, WL<J+1:2J> and DPWL<1:2> arranged in parallel between the first and second select lines, where 3 is a natural number equal to or greater than 1. The first select line may be a source select line SSL, and the second select line may be a drain select line DSL. In the following descriptions, the first select line will be represented by 'SSL', and the second select line will be represented by 'DSL'. The plurality of word lines SPWL<1:2>, WL<1:J>, CPWL<1:2>, WL<J+1:2J> and DPWL<1:2> may include normal word lines WL<1:2J> and dummy word lines SPWL<1:2>, CPWL<1:2> and DPWL<1:2>. One or more word lines adjacent to the source select line SSL, among the plurality of word lines SPWL<1:2>, WL<1:J>, CPWL<1:2>, WL<J+1:2J> and DPWL<1:2>, may be used as first dummy word lines SPWL<1:2>. Furthermore, one or more word lines adjacent to the drain select line DSL, among the plurality of word lines SPWL<1:2>, WL<1:J>, CPWL<1:2>, WL<J+1:2J> and DPWL<1:2>, may be used as second dummy word lines DPWL<1:2>. Furthermore, one or more word lines located in the center, among the plurality of word lines SPWL<1:2>, WL<1:J>, CPWL<1:2>, WL<J+1:2J> and DPWL<1:2>, may be used as third dummy word lines CPWL<1:2>.

More specifically, the memory block 152 may include a plurality of strings ST coupled between the bit lines BL1 to BLn and the source line SL. The bit lines BL1 to BLn may be coupled to the respective strings ST, and the source line SL may be coupled to the strings ST in common. Since the strings ST may be configured in the same manner as one another, the string ST coupled to a first bit line BL1 will be taken as an example for description.

The string ST may include a source select transistor SST, a plurality of memory cells and a drain select transistor DST, which are coupled in series between the source line SL and the first bit line BL1. One string ST may include one or more source select transistors SST and one or more drain select transistors DST.

The source of the source select transistor SST may be coupled to the source line SL, and the drain of the drain select transistor DST may be coupled to the first bit line BL1. The memory cells may be coupled in series between the source select transistor SST and the drain select transistor DST. The gates of source select transistors SST included in different strings ST may be coupled to the source select line SSL, the gates of drain select transistors DST included in different strings ST may be coupled to the drain select line DSL, and the gates of memory cells included in different strings ST may be coupled to the plurality of word lines SPWL<1:2>, WL<1:J>, CPWL<1:2>, WL<J+1:2J> and DPWL<1:2>. A group of memory cells coupled to the same word line, among the memory cells included in different strings ST, may be referred to as a physical page PPG. Therefore, the number of physical pages PPG may correspond to the number of the normal word lines WL<1:2J> among the plurality of word lines SPWL<1:2>, WL<1:J>, CPWL<1:2>, WL<J+1:2J> and DPWL<1:2> included in the memory block 152.

One memory cell may store 1-bit data therein. Such a cell is typically referred to as an SLC (Single Level Cell). In this case, one physical page PPG may store data of one logical page LPG. The data of one logical page LPG may include a plurality of data bits corresponding to the number of cells included in one physical page PPG. Furthermore, one memory cell may store 2 or more-bit data therein. Such a cell is typically referred to as an MLC (Multi-Level Cell). In this case, one physical page PPG may store data of two or more logical pages LPG.

Figure 4:
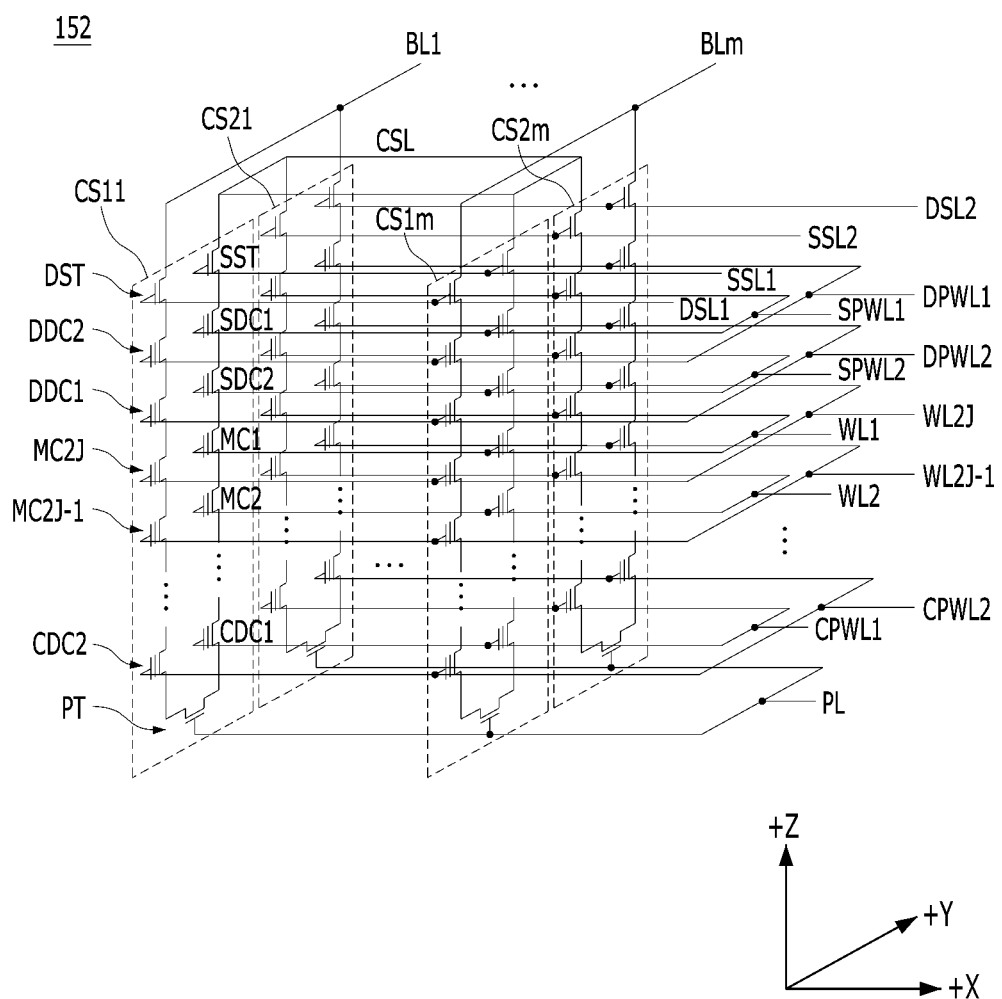
FIG. 4 is a diagram for describing another example of the memory block illustrated in FIG. 2, in accordance with an embodiment of the present invention.

FIG. 4 is a diagram for describing another example of the memory block illustrated in FIG. 2, in accordance with an embodiment of the present invention.

FIG. 4 illustrates an example of the case in which the memory block illustrated in FIG. 2 is configured in a 3D manner.

Specifically, the memory block 152 may include a plurality of cell strings CS11 to CS1$m$ and CS21 to CS2$m$. In an embodiment, each of the cell strings CS11 to CS1$m$ and CS21 to CS2$m$ may be formed in a U-shape. The memory block 152 may include m cell strings arranged in a row direction (i.e. +X direction). FIG. 4 illustrates that two cell strings are arranged in a column direction (i.e. +Y direction). However, this is only an example for convenience of description, and it may be understood that three or more cell strings may be arranged in the column direction.

Each of the cell strings CS11 to CS1$m$ and CS21 to CS2$m$ may include one or more source select transistors SST, one or more source-side dummy memory cells SDC1 and SDC2, first to 2J$^{th}$ normal memory cells MC1 to MC2J, one or more center dummy memory cells CDC1 and CDC2 located in the center of the 2J normal memory cells, a pipe transistor PT, one or more drain-side dummy memory cells DDC1 and DDC2, and one or more drain select transistors DST.

The select transistors SST and DST, the dummy memory cells SDC1, SDC2, CDC1, CDC2, DDC1 and DDC2 and the normal memory cells MC1 to MC2J may have similar structures to one another. In an embodiment, each of the select transistors SST and DST, the dummy memory cells SDC1, SDC2, CDC1, CDC2, DDC1 and DDC2 and the normal memory cells MC1 to MC2J may include a channel layer, a tunneling dielectric layer, a charge storage layer and a blocking dielectric layer.

The source select transistor SST of each cell string may be coupled between a common source line CSL and the source-side dummy memory cells SDC1 and SDC2.

In an embodiment, the source select transistors of the cell strings arranged at the same row may be coupled to a source select line extended in the row direction. The source select transistors of the cell strings arranged at different rows may be coupled to different source select lines, respectively. In FIG. 4, the source select transistors of the cell strings CS11 to CS1m at the first row may be coupled to a first source select line SSL1. The source select transistors of the cell strings CS21 to CS2m at the second row may be coupled to a second source select line SSL2.

Each cell string may include two source-side dummy memory cells SDC1 and SDC2. However, this is only an example, and it may be understood that each cell string may include three or more source-side dummy memory cells. The source-side dummy memory cells SDC1 and SDC2 of each cell string may be coupled in series between the source select transistor SST and the normal memory cells MC1 to MO. The gate of the first source-side dummy memory cell SDC1 of each cell string may be coupled to a first source-side dummy word line SPWL1. The gate of the second source-side dummy memory cell SDC2 may be coupled to a second source-side dummy word line SPWL2.

Among the first to $2J^{th}$ normal memory cells MC1 to MC2J of each cell string, 3 normal memory cells MC1 to MCJ may be coupled between the source-side dummy memory cells SDC1 and SDC2 and the center dummy memory cells CDC1 and CDC2, and the other 3 normal memory cells MC3+1 to MC2J may be coupled between the center dummy memory cells CDC1 and CDC2 and the drain-side dummy memory cells DDC1 and DDC2.

The first to $2J^{th}$ normal memory cells MC1 to MC2J may be divided into the first to $J^{th}$ normal memory cells MC1 to MCJ and the $(J+1)^{th}$ to $2J^{th}$ normal memory cells MC3+1 to MC2J. The first to $J^{th}$ normal memory cells MC1 to MCJ may be sequentially arranged in the reverse direction to +Z direction, and coupled in series between the source-side dummy memory cells SDC1 and SDC2 and the center dummy memory cells CDC1 and CDC2. The $(J+1)^{th}$ to $2J^{th}$ normal memory cells MCJ+1 to MC2J may be sequentially arranged in the +Z direction, and coupled in series between the center dummy memory cells CDC1 and CDC2 and the drain-side dummy memory cells DDC1 and DDC2. The first to $J^{th}$ normal memory cells MC1 to MCJ and the $(J+1)^{th}$ to $2J^{th}$ normal memory cells MCJ+1 to MC2J may be coupled through the pipe transistor PT. That is, the center dummy memory cells CDC1 and CDC2 may be located in the center of the first to $2J^{th}$ normal memory cells MC1 to MC2J, and coupled in series to the pipe transistor PT. The gates of the first to $2J^{th}$ normal memory cells MC1 to MC2J of each cell string may be coupled to the first to $2J^{th}$ normal word lines WL1 to WL2J, respectively.

Each cell string may include two center dummy memory cells CDC1 and CDC2. However, this is only an example, and it may be understood that each cell string may include three or more source-side dummy memory cells. The gate of a first center dummy memory cell CDC1 of each cell string may be coupled to a first center dummy word line CPWL1. The gate of a second center dummy memory cell CDC2 may be coupled to a second center dummy word line CPWL2.

Through first to $m^{th}$ bit lines BL1 to BLm, data may be stored in the first to $2J^{th}$ normal memory cells MC1 to MC2J. The data stored in the first to $2J^{th}$ normal memory cells MC1 to MC2J may be read through the first to $m^{th}$ bit lines BL1 to BLm.

The gate of the pipe transistor PT of each cell string may be coupled to a pipe line PL.

Each cell string may include two drain-side dummy memory cells DDC1 and DDC2. However, this is only an example, and it may be understood that each cell string may include three or more drain-side dummy memory cells. The drain-side dummy memory cells DDC1 and DDC2 of each cell string may be coupled in series between the drain select transistor DST and the normal memory cells MCJ+1 to MC2J. The gate of a first drain-side dummy memory cell DDC1 of each cell string may be coupled to a first drain-side dummy word line DPWL1. The gate of a second drain-side dummy memory cell DDC2 of each cell string may be coupled to a second drain-side dummy word line DPWL2.

The drain select transistor DST of each cell string may be coupled between the corresponding bit line and the drain-side dummy memory cells DDC1 and DDC2. Cell strings arranged in the row direction may be coupled to a drain select line extended in the row direction. The drain select transistors of the cell strings CS11 to CS1m at the first row may be coupled to a first drain select line DSL1. The drain select transistors of the cell strings CS21 to CS2m at the second row may be coupled to a second drain select line DSL2.

Cell strings arranged in the column direction may be coupled to a bit line extended in the column direction. In FIG. 4, the cell strings CS11 and CS21 at the first column may be coupled to the first bit line BL1. The cell strings CS1m and CS2m at the $m^{th}$ column may be coupled to the $m^{th}$ bit line BLm.

In another embodiment, even bit lines and odd bit lines may be provided instead of the first to $m^{th}$ bit lines BL1 to BLm. Even cell strings of the cell strings CS11 to CS1m or CS21 to CS2m arranged in the row direction may be coupled to the even bit lines, respectively, and odd cell strings of the cell strings CS11 to CS1m or CS21 to CS2m arranged in the row direction may be coupled to the odd bit lines, respectively.

Each of the dummy memory cells SDC1, SDC2, CDC1, CDC2, DDC1 and DDC2 may be provided to stably control the voltage or current of the corresponding cell string. For example, the source-side dummy memory cells SDC1 and SDC2 may be provided to reduce the electric fields between the source select transistor SST and the normal memory cells MC1 to MCJ. For example, the drain-side dummy memory cells DDC1 and DDC2 may be provided to reduce the electric fields between the drain select transistor DST and the normal memory cells MCJ+1 to MC2J. For example, the center dummy memory cells CDC1 and CDC2 may provided to divide the normal memory cells MC1 to MC2J into two groups MC1 to MCJ and MCJ+1 to MC2J, and to reduce the electric field between the two groups. As more dummy memory cells are provided, the reliability of the operation for the memory block 152 may be improved, but the size of the memory block 152 may be increased. As less dummy memory cells are provided, the size of the memory block 152 may be decreased, but the reliability of the operation for the memory block 152 may be reduced.

Figure 5:
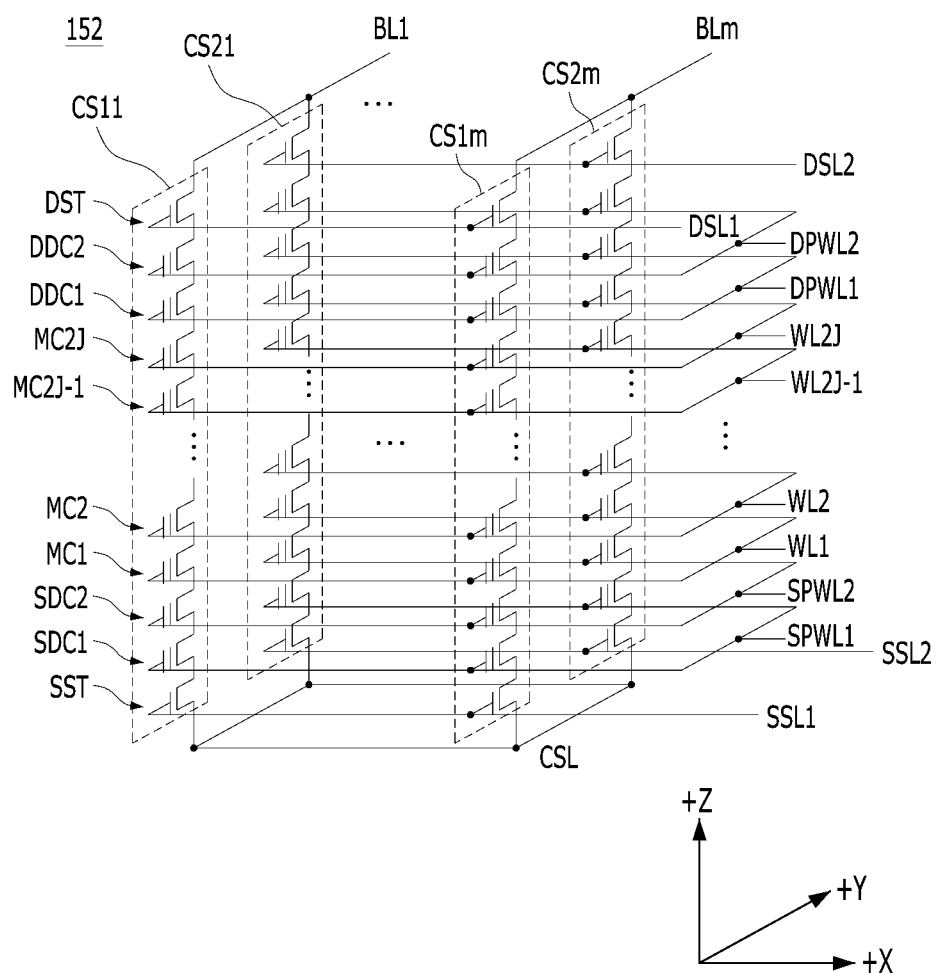
FIG. 5 is a diagram for describing still another example of the memory block illustrated in FIG. 2, in accordance with an embodiment of the present invention.

FIG. 5 is a diagram for describing still another example of the memory block illustrated in FIG. 2, in accordance with an embodiment of the present invention.

FIG. 5 illustrates another example of the case in which the memory block illustrated in FIG. 2 is configured in a 3D manner.

Specifically, the memory block 152 may include a plurality of cell strings CS11 to CS1m and CS21 to CS2m. The plurality of cell strings CS11 to CS1m and CS21 to CS2m may be extended in the +Z direction. Each of the cell strings CS11 to CS1m and CS21 to CS2m may include one or more source select transistors SST, one or more source-side dummy memory cells SDC1 and SDC2, first to $J^{th}$ normal memory cells MC1 to MCJ, one or more center dummy memory cells, $(J+1)^{th}$ to $2J^{th}$ normal memory cells MCJ+1 to MC2J, one or more drain-side dummy memory cells DDC1 to DDC2, and one or more drain select transistors DST, which are stacked over a substrate (not illustrated) under a memory block BLK1. The one or more center dummy memory cells are not illustrated, and located between the normal memory cells as illustrated in FIG. 3.

The source select transistor SST of each cell string may be coupled between a common source line CSL and the source-side dummy memory cells SDC1 and SDC2. The source select transistors of cell strings (for example, CS11 to CS1m) arranged at the same row may be coupled to the same source select line (for example, SSL1). The source select transistors of the cell strings CS11 to CS1m arranged at the first row may be coupled to a first source select line SSL1. The source select transistors of the cell strings CS21 to CS2m arranged at the second row may be coupled to a second source select line SSL2.

The source-side dummy memory cells SDC1 and SDC2 of each cell string may be coupled in series between the source select transistor SST and the normal memory cells MC1 to MCJ. Source-side dummy memory cells at the same height may be coupled to the same source-side dummy word line. The gates of the first and second source-side dummy memory cells SDC1 and SDC2 may be coupled to first and second source-side dummy word lines SPWL1 and SPWL2, respectively.

The first to $J^{th}$ normal memory cells MC1 to MCJ of each cell string may be coupled in series between the source-side dummy memory cells SDC1 and SDC2 and center dummy memory cells (not illustrated). The gates of the first to $J^{th}$ normal memory cells MC1 to MCJ may be coupled to first to $J^{th}$ normal word lines WL1 to WLJ, respectively.

The center dummy memory cells (not illustrated) of each cell string may be coupled in series between the normal memory cells MC1 to MCJ and the normal memory cells MCJ+1 to MC2J. The center dummy memory cells at the same height may be coupled to the same center dummy word line.

The $(J+1)^{th}$ to $2J^{th}$ normal memory cells MCJ+1 to MC2J of each cell string may be coupled in series between the center dummy memory cells (not illustrated) and the drain-side dummy memory cells DDC1 and DDC2. The gates of the $(J+1)^{th}$ to $2J^{th}$ normal memory cells MCJ+1 to MC2J may be coupled to $(J+1)^{th}$ to $2J^{th}$ normal word lines WLJ+1 to WL2J, respectively.

The drain-side dummy memory cells DDC1 and DDC2 of each cell string may be coupled in series between the drain select transistor DST and the normal memory cells MC1 to MC2J. Drain-side dummy memory cells at the same height may be coupled to the same source-side dummy word line. The gates of the first and second drain-side dummy memory cells DDC1 and DDC2 may be coupled to first and second drain-side dummy word lines DPWL1 and DPWL2, respectively.

The drain select transistor DST of each cell string may be coupled between the corresponding bit line and the drain-side dummy memory cells DDC1 and DDC2. The drain select transistors of cell strings arranged in the row direction may be coupled to a drain select line extended in the row direction. The drain select transistors of the cell strings CS11 to CS1m at the first row may be coupled to a first drain select line DSL1. The drain select transistors of the cell strings CS21 to CS2m at the second row may be coupled to a second drain select line DSL2.

As a result, the memory block 152 of FIG. 5 has an equivalent circuit to the memory block 152 of FIG. 4, except that the pipe transistor PT is excluded from each cell string.

Figure 6:
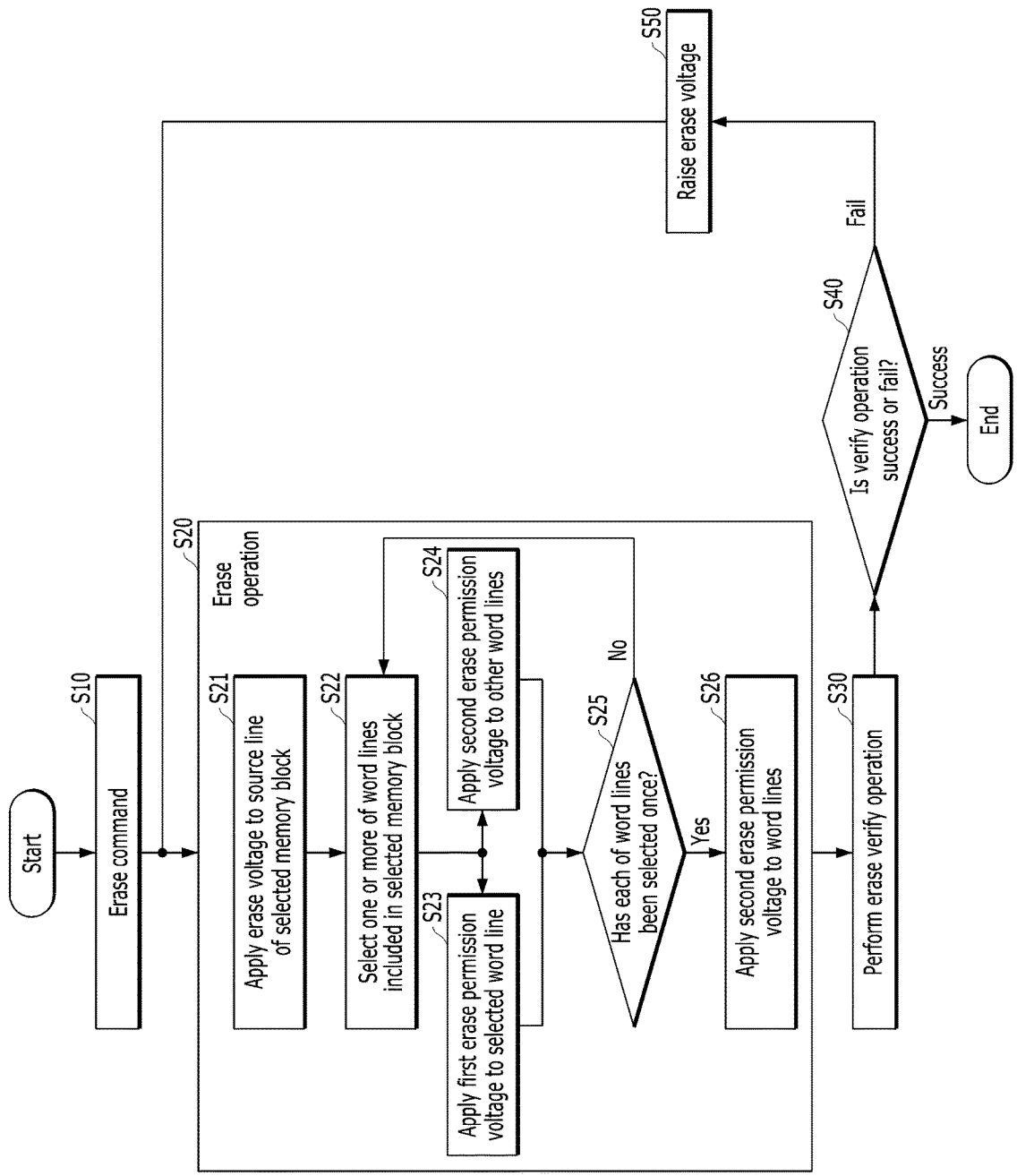
FIG. 6 is a flowchart for describing an example of an erase operation performed by the memory device in accordance with an embodiment of the present invention.

FIG. 6 is a flowchart for describing an example of an erase operation performed by the memory device in accordance with an embodiment of the present invention.

Referring to FIGS. 1 to 6, the example of the erase operation performed by the memory device 150 in accordance with an embodiment of the present invention will be described as follows.

As described with reference to FIG. 2, the memory device 150 may include the memory cell array 151, the peripheral circuit 200 and the control logic 300.

The memory cell array 151 may include the plurality of memory blocks 152 each including a plurality of memory cells and the plurality of word lines SPWL<1:2>, WL<1:J>, CPWL<1:2>, WL<J+1:2J> and DPWL<1:2> arranged between a first select line SSL and a second select line DSL. The specific embodiments for the plurality of memory blocks 152 have been described with reference to FIGS. 3 to 5.

The peripheral circuit 200 may apply an erase voltage to the source line or the drain line of a memory block selected among the plurality of memory blocks 152, in order to perform the erase operation.

For reference, an operation of erasing memory cells in a program state through a method of raising the potential level of a channel of a selected memory block by applying the erase voltage to the source line or the drain line of the selected memory block may be defined as a GIDL (Gate Induced Drain Leakage)-based erase operation. During the GIDL-based erase operation, the erase voltage may be applied to the source line or drain line of the selected memory block and then the select lines SSL and DSL having an 'on' voltage level may be switched to become floated so that the entire channel of the selected string is precharged to a level of a high voltage from the bit line and/or source line. That is, during the GIDL-based erase operation, electrons stored in the charge storage layers of the memory cells in the program state among the plurality of memory cells included in the selected memory block may be de-trapped by a high potential level of the channel and low potential levels of word lines WLs. Thus, the memory cells in the program state may transition to the erase state.

In a period during which the erase operation is performed (hereinafter, referred to as an erase operation period), the control logic 300 may control the peripheral circuit 200 to sequentially select one of the plurality of word lines included in the selected memory block from a word line closest to the first select line SSL to a word line farthest from the first and second select lines SSL and DSL, to concurrently select one of the plurality of word lines from a word line closest to the second select line DSL to the word line farthest from the first and second select lines SSL and DSL, and to apply a first erase permission voltage to the selected word lines while applying a second erase permission voltage to remaining word lines except the word lines selected to apply the first erase permission voltage, among the plurality of word lines included in the selected memory block.

At this time, the first erase permission voltage may have a lower potential level than the second erase permission voltage. For example, when the second erase permission voltage has a ground voltage level VSS, the first erase permission voltage may have a negative level lower than the ground voltage level VSS. For example, the first erase permission voltage may have a level of −2V.

More specifically, the memory device 150 may receive an erase command from the controller 130 in S10. At this time, the controller 130 may generate the erase command and transfer the generated erase command to the memory device 150, according to a request of the host 102. Furthermore, the controller 130 may generate the erase command and transfer the generated erase command to the memory device 150, according to an internal operation, for example, a background operation such as garbage collection.

The memory device 150 may perform the erase operation in response to the erase command in an erase operation period S20.

As described above, the control logic 300 included in the memory device 150 may control the operation of the peripheral circuit 200 to perform the erase operation, in response to the erase command transferred from the controller 130.

For example, the control logic 300 may control the peripheral circuit 200 to select a memory block among the plurality of memory blocks 152 and to perform the erase operation, in response to the erase command.

Furthermore, in the erase operation period S20, the control logic 300 may control the source line driver 270 included in the peripheral circuit 200 to apply the erase voltage to the source line of the memory block selected among the plurality of memory blocks 152, in S21. At this time, the voltage generating circuit 210 included in the peripheral circuit 200 may generate the erase voltage and provide the generated erase voltage to the source line driver 270 in the erase operation period under control of the control logic 300.

Furthermore, in the erase operation period S20, the control logic 300 may control the source line driver 270 included in the peripheral circuit 200 to select one or more word lines among the plurality of word lines SPWL<1:2>, WL<1:J>, CPWL<1:2>, WL<J+1:2J> and DPWL<1:2> included in the selected memory block, and to apply the first erase permission voltage to the selected one or more word lines, in S22 and S23.

Furthermore, in the erase operation period S20, the control logic 300 may control the source line driver 270 included in the peripheral circuit 200 to apply the second erase permission voltage to remaining word lines except the selected word lines among the plurality of word lines SPWL<1:2>, WL<1:J>, CPWL<1:2>, WL<J+1:2J> and DPWL<1:2> included in the selected memory block, in S22 and S24.

Furthermore, although not illustrated in FIG. 6, in the erase operation period S20, the control logic 300 may control the source line driver 270 included in the peripheral circuit 200 to float the first and second select lines SSL and DSL among the local lines of the selected memory block at least after step S21. Accordingly, the entire channel of the selected string is precharged to a level of a high voltage from the bit line and/or source line. Furthermore, in the erase operation period S20, the control logic 300 may control the page buffer group 230 included in the peripheral circuit 200 to float a bit line of the selected memory block.

Furthermore, in the erase operation period S20, the control logic 300 may check whether each of the plurality of word lines SPWL<1:2>, WL<1:J>, CPWL<1:2>, WL<J+1:2J> and DPWL<1:2> included in the selected memory block has been selected once as the selected word line and has received the first erase permission voltage, in S25. When the check result indicates that each of the word lines SPWL<1:2>, WL<1:J>, CPWL<1:2>, WL<J+1:2J> and DPWL<1:2> has been selected once (Yes in S25), the control logic 300 may control the source line driver 270 included in the peripheral circuit 200 to apply the second erase permission voltage to the entire word lines SPWL<1:2>, WL<1:J>, CPWL<1:2>, WL<J+1:2J> and DPWL<1:2>, until the erase operation period S20 performed for a predetermined time is ended, in S26. When the check result indicates that there is an unselected word line among the plurality of word lines SPWL<1:2>, WL<1:J>, CPWL<1:2>, WL<J+1:2J> and DPWL<1:2> (No in S25), the control logic 300 may select the unselected word line and apply the first erase permission voltage to the selected word line, in S22 and S23.

Figure 8A:
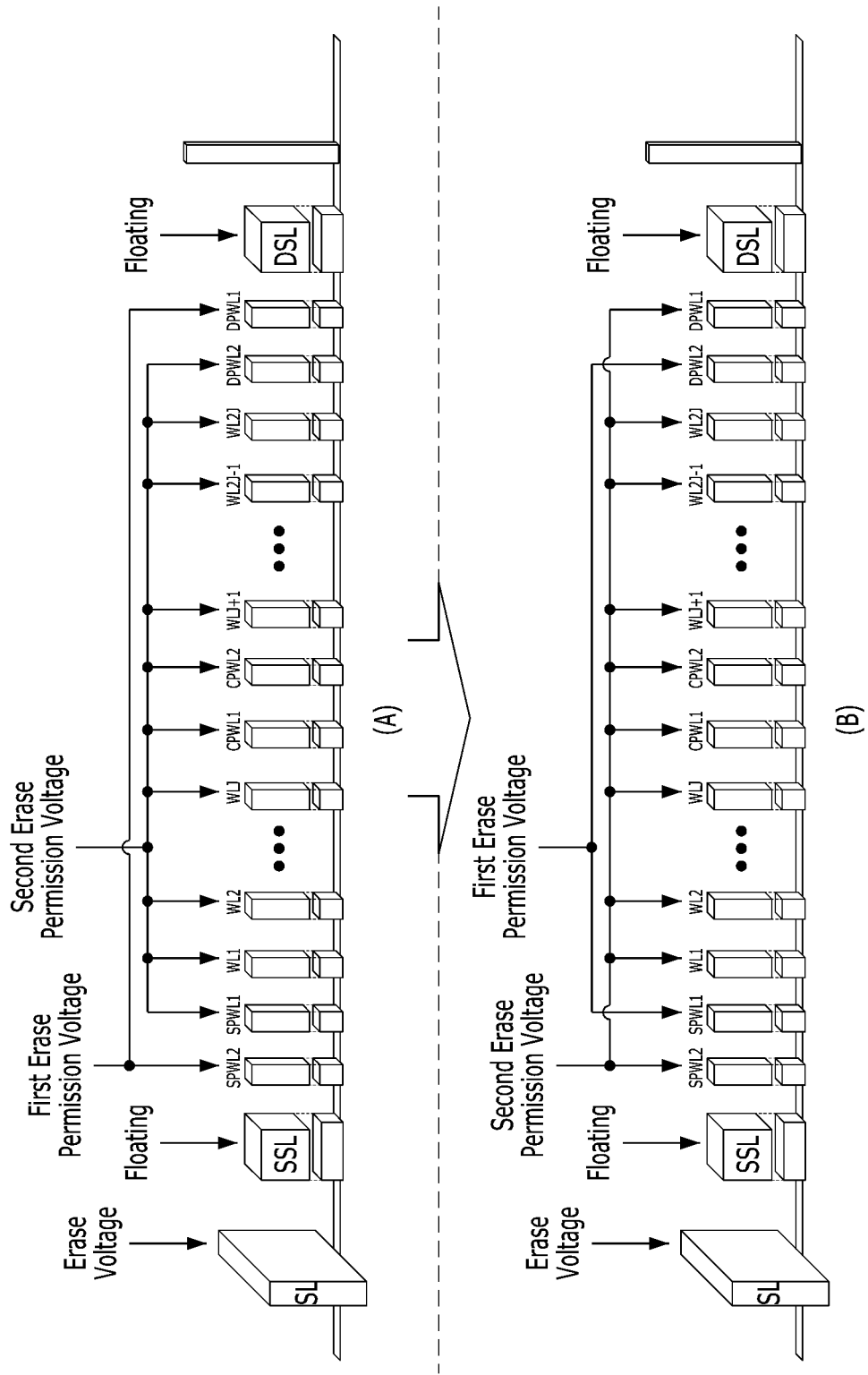
FIGS. 8A to 8C are diagrams for describing an erase operation method of the memory device in accordance with an embodiment of the present invention.
Figure 8B:
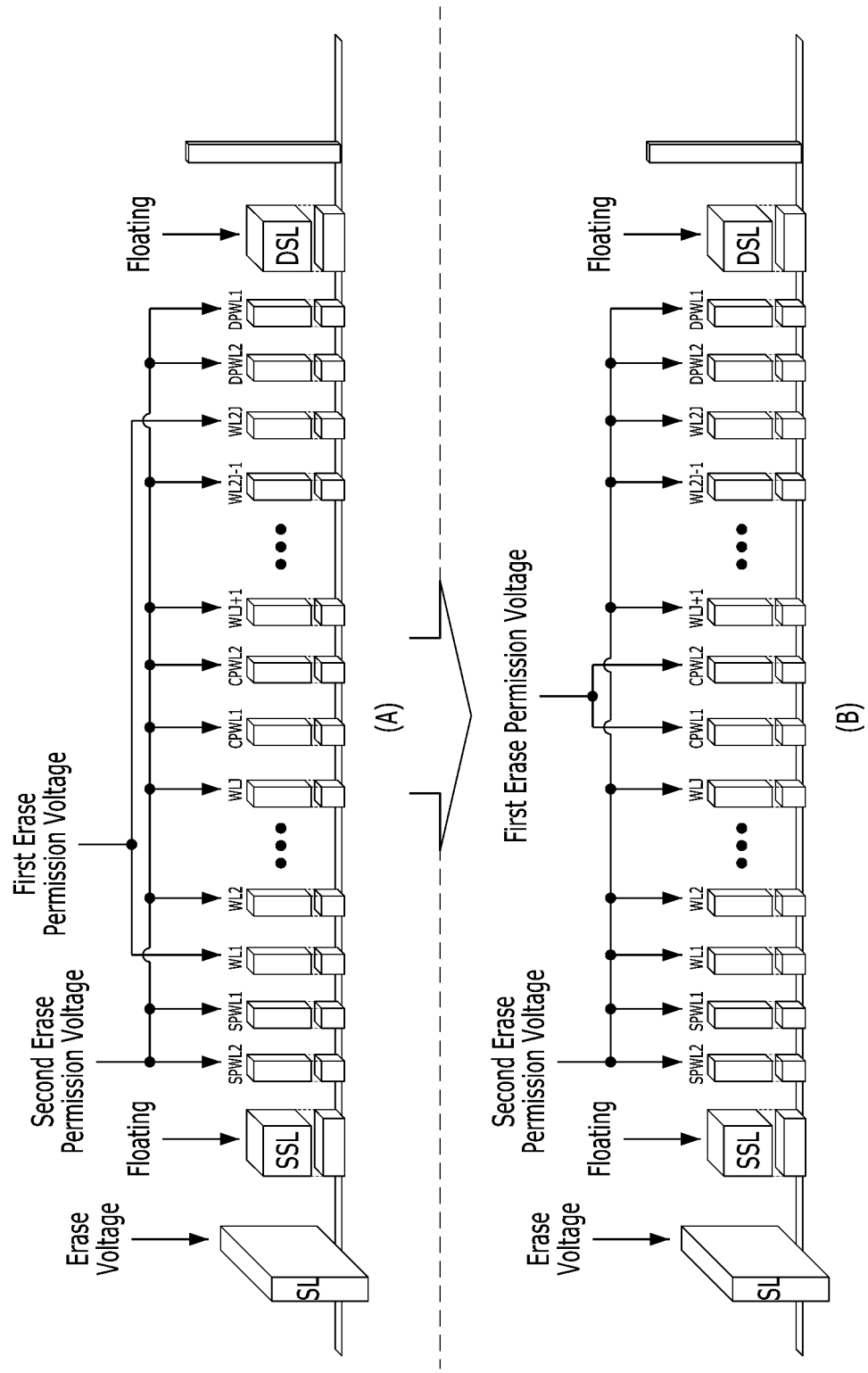
Figure 8C:
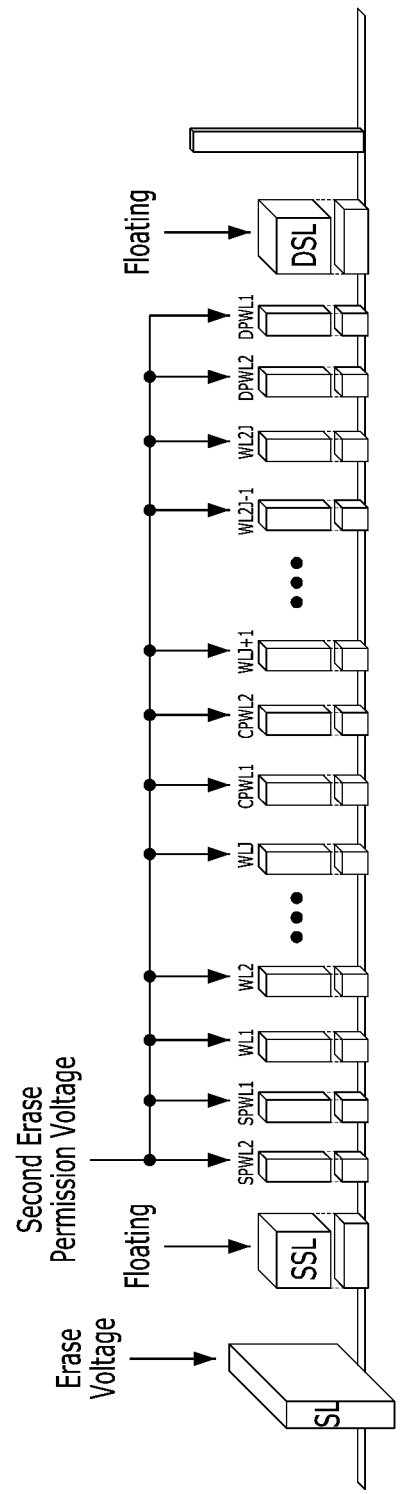

FIGS. 8A to 8C show how the peripheral circuit 200 of the memory device 150 in accordance with an embodiment of the present invention, selects the plurality of word lines SPWL<1:2>, WL<1:J>, CPWL<1:2>, WL<J+1:2J> and DPWL<1:2> and which erase permission voltage the peripheral circuit 200 applies to the selected word lines, in the erase operation period S20.

First, FIGS. 8A to 8C may be based on the plurality of word lines SPWL<1:2>, WL<1:J>, CPWL<1:2>, WL<J+1:2J> and DPWL<1:2> including the source-side dummy word lines SPWL1 and SPWL2, the center dummy word lines CPWL1 and CPWL2 and the drain-side dummy word lines DPWL1 and DPWL2 as illustrated in FIGS. 3 to 5. The configuration in which the dummy word lines are included is only an embodiment, and some dummy word lines or no dummy word lines may be disposed, according to a designer's selection.

Operation [A] of FIG. 8A shows the state immediately after the erase operation period S20 started. That is, the peripheral circuit 200 may apply the erase voltage to the source line SL of a selected memory block and float the first and second select lines SSL and DSL.

Accordingly, the entire channel of the selected string may be precharged to a level of a high voltage from the bit line and/or source line. The peripheral circuit 200 may select, as the selected word lines, word lines which are the closest to the respective first and second select lines SSL and DSL, among the plurality of word lines SPWL<1:2>, WL<1:J>, CPWL<1:2>, WL<J+1:2J> and DPWL<1:2> included in the selected memory block, i.e. the second source-side dummy word line SPWL2 and the first drain-side dummy word line DPWL1, and apply the first erase permission voltage to the selected word lines. Furthermore, the peripheral circuit 200 may apply the second erase permission voltage to remaining word lines SPWL<1>, WL<1:J>, CPWL<1:2>, WL<J+1:2J> and DPWL<2> except the selected word lines, i.e. the second source-side dummy word line SPWL2 and the first drain-side dummy word line DPWL1, among the plurality of word lines SPWL<1:2>, WL<1:J>, CPWL<1:2>, WL<J+1:2J> and DPWL<1:2> included in the selected memory block.

Operation [B] of FIG. 8A shows the state of the erase operation period S20 after operation [A] of FIG. 8A. That is, the peripheral circuit 200 may continuously apply the erase voltage to the source line SL of the selected memory block and float the first and second select lines SSL and DSL. Accordingly, the entire channel of the selected string may stay precharged to the high voltage level. Furthermore, the peripheral circuit 200 may select, as the selected word lines, word lines which are the second closest to the respective first and second select lines SSL and DSL, among the plurality of word lines SPWL<1:2>, WL<1:J>, CPWL<1:2>, WL<J+1:2J> and DPWL<1:2> included in the selected memory block, i.e. the first source-side dummy word line SPWL1 and the second drain-side dummy word line DPWL2, and apply the first erase permission voltage to the selected word lines. Furthermore, the peripheral circuit 200 may apply the second erase permission voltage to remaining word lines SPWL<2>, WL<1:J>, CPWL<1:2>, WL<J+1:2J> and DPWL<1> except the selected word lines, i.e. the first source-side dummy word line SPWL1 and the second drain-side dummy word line DPWL2, among the plurality of word lines SPWL<1:2>, WL<1:J>, CPWL<1:2>, WL<J+1:2J> and DPWL<1:2> included in the selected memory block.

Operation [A] of FIG. 8B shows the state of the erase operation period S20 after operation [B] of FIG. 8A. That is, the peripheral circuit 200 may continuously apply the erase voltage to the source line SL of the selected memory block and float the first and second select lines SSL and DSL. Accordingly, the entire channel of the selected string may stay precharged to the high voltage level. Furthermore, the peripheral circuit 200 may select, as the selected word lines, word lines which are the third closest to the respective first and second select lines SSL and DSL among the plurality of word lines SPWL<1:2>, WL<1:J>, CPWL<1:2>, WL<J+1:2J> and DPWL<1:2>, i.e. the first normal word line WL1 and the 23th normal word line WL2J, and apply the first erase permission voltage to the selected word lines. Furthermore, the peripheral circuit 200 may apply the second erase permission voltage to remaining word lines SPWL<1:2>, WL<2:J>, CPWL<1:2>, WL<J+1:2J−1> and DPWL<1:2> except the selected word lines, i.e. the first normal word line WL1 and the $2J^{th}$ normal word line WL2J, among the plurality of word lines SPWL<1:2>, WL<1:J>, CPWL<1:2>, WL<J+1:2J> and DPWL<1:2> included in the selected memory block.

Operation [B] of FIG. 8B shows the state in which an operation of selecting, as the selected word lines, two word lines among the plurality of word lines SPWL<1:2>, WL<1:J>, CPWL<1:2>, WL<J+1:2J> and DPWL<1:2> has been repeated (J+3) times, as the erase operation period S20 has continued after operation [A] of FIG. 8B. That is, the peripheral circuit 200 may continuously apply the erase voltage to the source line SL of the selected memory block and float the first and second select lines SSL and DSL. Accordingly, the entire channel of the selected string may stay precharged to the high voltage level. Furthermore, the peripheral circuit 200 may select, as the selected word lines, two word lines located in the center among the plurality of word lines SPWL<1:2>, WL<1:J>, CPWL<1:2>, WL<J+1:2J> and DPWL<1:2>, i.e. the first and second center dummy word lines CPWL1 and CPWL2, and apply the first erase permission voltage to the selected word lines. Furthermore, the peripheral circuit 200 may apply the second erase permission voltage to remaining word lines SPWL<1:2>, WL<1:J>, WL<J+1:2J> and DPWL<1:2> except the selected word lines, i.e. the first and second center dummy word lines CPWL1 and CPWL2, among the plurality of word lines SPWL<1:2>, WL<1:J>, CPWL<1:2>, WL<J+1:2J> and DPWL<1:2> included in the selected memory block.

The state after operation [B] of FIG. 8B may correspond to the state in which the erase operation period S20 has not yet been ended, and each of the word lines SPWL<1:2>, WL<1:J>, CPWL<1:2>, WL<J+1:2J> and DPWL<1:2> has been selected once as the selected word line and has received the first erase permission voltage (an example of S25). Therefore, as illustrated in FIG. 8C, the peripheral circuit 200 may apply the second erase permission voltage to the entire word lines SPWL<1:2>, WL<1:J>, CPWL<1:2>, WL<J+1:2J> and DPWL<1:2> included in the selected memory block, until the erase operation period S20 is ended after operation [B] of FIG. 8B. That is, the peripheral circuit 200 may not apply the first erase permission voltage any more.

As described above, in the erase operation period S20, the peripheral circuit 200 may sequentially select, as the selected word line, one of the plurality of word lines SPWL<1:2>, WL<1:J>, CPWL<1:2>, WL<J+1:2J> and DPWL<1:2> included in the selected memory block from the word line SPWL<2> closest to the first select line SSL to the word line CPWL<1> farthest from the first and second select lines SSL and DSL. Concurrently, the peripheral circuit 200 may select one of the plurality of word lines SPWL<1:2>, WL<1:J>, CPWL<1:2>, WL<J+1:2J> and DPWL<1:2> from the word line DPWL<1> closest to the second select line DSL to the word line CPWL<2> farthest from the first and second select lines SSL and DSL. For example, as illustrated in FIGS. 8A to 8C, the peripheral circuit 200 may select two word lines at a time as the selected word lines, and apply the first erase permission voltage to the selected word lines.

Furthermore, in the erase operation period S20, the peripheral circuit 200 may apply the second erase permission voltage to remaining word lines except the word lines selected to apply the first erase permission voltage, among the plurality of word lines SPWL<1:2>, WL<1:J>, CPWL<1:2>, WL<J+1:2J> and DPWL<1:2> included in the selected memory block. At this time, the second erase permission voltage may be set to the ground voltage level VSS, and the first erase permission voltage may be set to a negative level lower than the ground voltage level VSS. Therefore, the erase operation of the peripheral circuit 200 that sequentially selects ones of the plurality of word lines SPWL<1:2>, WL<1:J>, CPWL<1:2>, WL<J+1:2J> and DPWL<1:2> from the word line SPWL<2> and DPWL<1>, which are closest to the first and second select lines SSL and DSL and located at both ends of a cell string, to the word lines CPWL<1:2> which are farthest from the first and second select lines SSL and DSL and located in the middle of the cell string, applies the first erase permission voltage to the selected word lines, and applies the second erase permission voltage to remaining word lines other than the selected word lines among the plurality of word lines SPWL<1:2>, WL<1:J>, CPWL<1:2>, WL<J+1:2J> and DPWL<1:2> can significantly increase hole mobility, which makes it possible to more rapidly de-trap electrons stored in the charge storage layers of the memory cells in the program state.

The memory device 150 may perform the erase verify operation in S30 after the erase operation period S20 performed for the predetermined time is ended, in order to check whether the erase operation for the selected memory block has been normally completed. For example, the memory device 150 may check whether the threshold voltages of the memory cells included in the selected memory block are equal to or lower than a target erase threshold voltage.

The memory device 150 may determine that the erase operation is a pass when the result S40 of the erase verify operation S30 indicates that the threshold voltages of all the memory cells or a first number or more of memory cells are equal to or lower than the target erase threshold voltage, and determine that the erase operation is a fail when the threshold voltages of a second number or more of memory cells are higher than the target erase threshold voltage. That is, when the result S40 of the erase verify operation S30 indicates that the erase operation is a pass (success in S40), the memory device 150 may end the erase operation. When the result S40 of the erase verify operation S30 indicates that the erase operation is a fail, the memory device 150 may raise the potential level of the erase voltage in S50, and then perform the erase operation S20 again using the erase voltage whose potential level is raised.

For example, the control logic 300 included in the memory device 150 may control the peripheral circuit 200 to perform the erase verify operation S30 after performing the erase operation S20 for the predetermined time. Furthermore, when the result S40 of the erase verify operation S30 indicates that the erase operation is a fail, the control logic 300 may set the erase voltage by raising the potential level of the erase voltage according to the ISPE (Increment Step Pulse Erase) method in S50, and control the peripheral circuit 200 to perform the erase operation S20 again by applying the set erase voltage.

Figure 7:
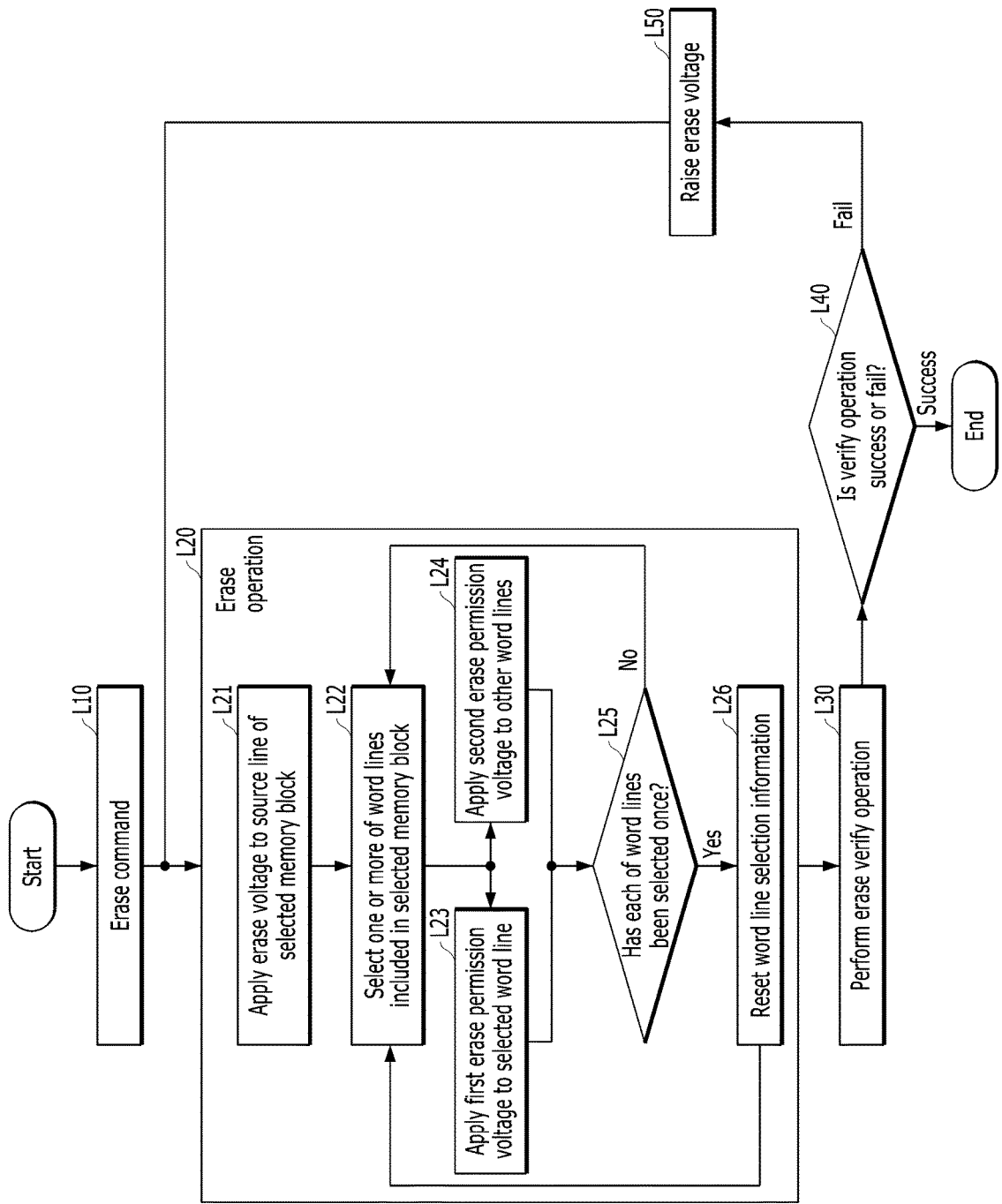
FIG. 7 is a flowchart for describing another example of the erase operation performed by the memory device in accordance with an embodiment of the present invention.

FIG. 7 is a flowchart for describing another example of the erase operation performed by the memory device in accordance with an embodiment of the present invention.

Referring to FIGS. 1 to 5 and 7, another example of the erase operation performed by the memory device 150 in accordance with an embodiment of the present invention will be described as follows.

As described with reference to FIG. 2, the memory device 150 may include the memory cell array 151, the peripheral circuit 200 and the control logic 300.

The memory cell array 151 may include a plurality of memory blocks 152 each including a plurality of memory cells and a plurality of word lines LPWL<1:2>, WL<1:J>, CPWL<1:2>, WL<J+1:2J> and DPWL<1:2> arranged between a first select line SSL and a second select line DSL. The specific embodiments for the plurality of memory blocks 152 have been described with reference to FIGS. 3 to 5.

The peripheral circuit 200 may perform the erase operation by applying an erase voltage to the source line or the drain line of a memory block selected among the plurality of memory blocks 152.

In an erase operation period, the control logic 300 may control the peripheral circuit 200 to sequentially select one of the plurality of word lines included in a selected memory block from a word line closest to the first select line SSL to a word line farthest from the first and second select lines SSL and DSL, to concurrently select one of the plurality of word lines from a word line closest to the second select line DSL to the word line farthest from the first and second select lines SSL and DSL and to apply a first erase permission voltage to the selected word lines while applying a second erase permission voltage to remaining word lines except the word lines selected to apply the first erase permission voltage, among the plurality of word lines included in the selected memory block.

At this time, the first erase permission voltage may have a lower potential level than the second erase permission voltage. For example, when the second erase permission voltage has a ground voltage level VSS, the first erase permission voltage may have a negative level lower than the ground voltage level VSS. For example, the first erase permission voltage may have a level of −2V.

More specifically, the memory device 150 may receive an erase command from the controller 130 in L10. At this time, the controller 130 may generate the erase command and transfer the generated erase command to the memory device 150, according to a request of the host 102. Furthermore, the controller 130 may generate the erase command and transfer the generated erase command to the memory device 150, according to an internal operation, for example, a background operation such as garbage collection.

The memory device 150 may perform the erase operation in response to the erase command in an erase operation period L20.

As described above, the control logic 300 included in the memory device 150 may control the operation of the peripheral circuit 200 to perform the erase operation, in response to the erase command transferred from the controller 130.

For example, the control logic 300 may control the peripheral circuit 200 to select a memory block among the plurality of memory blocks 152 and to perform the erase operation, in response to the erase command.

Furthermore, in the erase operation period L20, the control logic 300 may control the source line driver 270, included in the peripheral circuit 200, to apply the erase voltage to the source line of the memory block selected among the plurality of memory blocks 152, in L21. At this time, the voltage generating circuit 210 included in the peripheral circuit 200 may generate the erase voltage and provide the generated erase voltage to the source line driver 270 in the erase operation period, under control of the control logic 300.

Furthermore, in the erase operation period L20, the control logic 300 may control the source line driver 270 included in the peripheral circuit 200 to select one or more word lines among the plurality of word lines LPWL<1:2>, WL<1:J>, CPWL<1:2>, WL<J+1:2J> and DPWL<1:2> included in the selected memory block, and to apply the first erase permission voltage to the selected word lines, in L22 and L23.

Furthermore, in the erase operation period L20, the control logic 300 may control the source line driver 270 included in the peripheral circuit 200 to apply the second erase permission voltage to remaining word lines except the selected word lines among the plurality of word lines LPWL<1:2>, WL<1:J>, CPWL<1:2>, WL<J+1:2J> and DPWL<1:2> included in the selected memory block, in steps L22 and L24.

Furthermore, although not illustrated in FIG. 7, in the erase operation period L20, the control logic 300 may control the source line driver 270, included in the peripheral circuit 200, to float the first and second select lines SSL and DSL among the local lines of the selected memory block at least after step L21. Accordingly, the entire channel of the selected string is precharged to a level of a high voltage from the bit line and/or source line. Furthermore, in the erase operation period L20, the control logic 300 may control the page buffer group 230 included in the peripheral circuit 200 to float a bit line of the selected memory block.

Furthermore, in the erase operation period L20, the control logic 300 may check whether each of the word lines LPWL<1:2>, WL<1:J>, CPWL<1:2>, WL<J+1:2J> and DPWL<1:2> included in the selected memory block has been selected once as the selected word line and has received the first erase permission voltage, in L25. When the check result indicates that each of the word lines LPWL<1:2>, WL<1:J>, CPWL<1:2>, WL<J+1:2J> and DPWL<1:2> has been selected once (Yes in L25), the control logic 300 may reset information for distinguishing between the selected word lines and the unselected word lines among the word lines LPWL<1:2>, WL<1:J>, CPWL<1:2>, WL<J+1:2J> and DPWL<1:2>, in L26. Therefore, when each of the word lines LPWL<1:2>, WL<1:J>, CPWL<1:2>, WL<J+1:2J> and DPWL<1:2> has been selected once (Yes in L25), the control logic 300 may reset each of the word lines LPWL<1:2>, WL<1:J>, CPWL<1:2>, WL<J+1:2J> and DPWL<1:2> to such a state that each of the word lines LPWL<1:2>, WL<1:J>, CPWL<1:2>, WL<J+1:2J> and DPWL<1:2> has never been selected. Then, the control logic 300 may repeat the operations L22, L23, L24 and L25 of sequentially selecting the individual word lines LPWL<1:2>, WL<1:J>, CPWL<1:2>, WL<J+1:2J> and DPWL<1:2>, applying the first erase permission voltage to the selected word lines while applying the second erase permission voltage to remaining word lines other than the selected word lines among the plurality of word lines LPWL<1:2>, WL<1:J>, CPWL<1:2>, WL<J+1:2J> and DPWL<1:2>, until the erase operation period L20 performed for a predetermined time is ended. When the check result indicates that there is an unselected word line among the plurality of word lines LPWL<1:2>, WL<1:J>, CPWL<1:2>, WL<J+1:2J> and DPWL<1:2> (No in L25), the control logic 300 may select the unselected word line and apply the first erase permission voltage to the selected word line, in L22 and L23.

FIGS. 8A and 8B show how the peripheral circuit 200 of the memory device 150 in accordance with the present embodiment selects the plurality of word lines SPWL<1:2>, WL<1:J>, CPWL<1:2>, WL<J+1:2J> and DPWL<1:2> and which erase permission voltage the peripheral circuit 200 applies to the selected word lines, in the erase operation period L20. At this time, since the descriptions of the erase operation of FIGS. 8A and 8B are disclosed in detail in the descriptions of the example of the erase operation with reference to FIG. 6, the descriptions thereof will be omitted herein. In the example of the erase operation described with reference to FIG. 6, the peripheral circuit 200 may operate as illustrated in FIG. 8C after operation [B] of FIG. 8B. However, in the another example of the erase operation described with reference to FIG. 7, the peripheral circuit 200 may perform operation [A] of FIG. 8A again after operation [B] of FIG. 8B. That is, in the another example of the erase operation described with reference to FIG. 7, the peripheral circuit 200 may repeat operations [A] and [B] of FIG. 8A and operations [A] and [B] of FIG. 8B, until the erase operation period L20 is ended.

The memory device 150 may perform an erase verify operation L30 after the erase operation period L20 performed for the predetermined time is ended, and check whether the erase operation for the selected memory block has been normally completed. For example, the memory device 150 may check whether the threshold voltages of the memory cells included in the selected memory block are equal to or lower than a target erase threshold voltage.

The memory device 150 may determine that the erase operation is a pass when the result L40 of the erase verify operation L30 indicates that the threshold voltages of all the memory cells or a first number or more of memory cells are equal to or lower than the target erase threshold voltage, and determine that the erase operation is a fail when the threshold voltages of a second number or more of memory cells are higher than the target erase threshold voltage. That is, when the result L40 of the erase verify operation L30 indicates that the erase operation is a pass (success in L40), the memory device 150 may end the erase operation. When the result L40 of the erase verify operation L30 indicates that the erase operation is a fail, the memory device 150 may raise the potential level of the erase voltage in L50, and then perform the erase operation L20 again using the erase voltage whose potential level is raised.

For example, the control logic 300 included in the memory device 150 may control the peripheral circuit 200 to perform the erase verify operation L30 after performing the erase operation L20 for the predetermined time. Furthermore, when the result L40 of the erase verify operation L30 indicates that the erase operation is a fail, the control logic 300 may set the erase voltage by raising the potential level of the erase voltage according to the ISPE (Increment Step Pulse Erase) method in L50, and control the peripheral circuit 200 to perform the erase operation L20 again by applying the set erase voltage.

As described above, in the erase operation period L20, the peripheral circuit 200 may sequentially select, as the selected word lines, the individual word lines LPWL<1:2>, WL<1:J>, CPWL<1:2>, WL<J+1:2J> and DPWL<1:2> included in the selected memory block from the outermost word lines LPWL<2> and DPWL<1> closest to the first and second select lines SSL and DSL to the innermost word lines CPWL<1:2> farthest from the first and second select lines SSL and DSL. For example, as illustrated in FIGS. 8A and 8B, the peripheral circuit 200 may select two word lines at a time as the selected word lines, and apply the first erase permission voltage to the selected word lines.

Furthermore, in the erase operation period L20, the peripheral circuit 200 may apply the second erase permission voltage to remaining word lines except the word lines selected to apply the first erase permission voltage, among the plurality of word lines LPWL<1:2>, WL<1:J>, CPWL<1:2>, WL<J+1:2J> and DPWL<1:2> included in the selected memory block. At this time, the second erase permission voltage may be set to the ground voltage level VSS, and the first erase permission voltage may be set to a negative level lower than the ground voltage level VSS. Therefore, the erase operation of the peripheral circuit 200 that sequentially selects the individual word lines LPWL<1:2>, WL<1:J>, CPWL<1:2>, WL<J+1:2J> and DPWL<1:2> from the outermost word lines LPWL<2> and DPWL<1>, which are closest to the first and second select lines SSL and DSL and located at both ends of a cell string, to the innermost word lines CPWL<1:2> which are farthest from the first and second select lines SSL and DSL and located in the middle of the cell string, and applies the first erase permission voltage to the selected word lines while applying the second erase permission voltage to remaining word lines other than the selected word lines among the plurality of word lines LPWL<1:2>, WL<1:J>, CPWL<1:2>, WL<J+1:2J> and DPWL<1:2> can significantly increase hole mobility, which makes it possible to more rapidly de-trap electrons stored in the charge storage layers of the memory cells in the program state.

Although various embodiments have been described for illustrative purposes, it will be apparent to those skilled in the art that various changes and modifications may be made without departing from the spirit and scope of the invention as defined in the following claims. Furthermore, the embodiments may be combined to form additional embodiments.

What is claimed is:
1. A memory device comprising:
a memory cell array comprising a plurality of memory blocks each including a plurality of memory cells and a plurality of word lines arranged between a first select line and a second select line;
a peripheral circuit suitable for performing an erase operation by applying an erase voltage to a source line or a drain line of a memory block selected among the plurality of memory blocks and then by floating the first and second select lines to precharge a channel of a cell string within the selected memory block; and
a control circuit suitable for controlling, in a period in which the erase operation is performed, the peripheral circuit to:
sequentially select one of the plurality of word lines from a word line closest to the first select line to a word line farthest from the first and second select lines, concurrently select one of the plurality of word lines from a word line closest to the second select line to the word line farthest from the first and second select lines, and apply a first erase permission voltage to the selected word lines while applying a second erase permission voltage to remaining word lines except the selected word lines among the plurality of word lines, wherein the first erase permission voltage has a lower potential level than the second erase permission voltage.

2. The memory device of claim 1, wherein the control circuit controls the peripheral circuit further to apply, after the sequentially selecting, the concurrently selecting and the applying for all of the plurality of word lines as the selected word lines, the second erase permission voltage to all of the word lines until the period ends.

3. The memory device of claim 1, wherein the control circuit controls the peripheral circuit further to repeat the sequentially selecting, the concurrently selecting and the applying until the period ends.

4. The memory device of claim 1, wherein the second erase permission voltage has a ground voltage level and the first erase permission voltage has a negative level lower than the ground voltage level.

5. The memory device of claim 1, wherein the plurality of word lines include a first dummy word line closest to the first select line, a second dummy word line closest to the second select line and a third dummy word line farthest from the first and second select lines.

6. The memory device of claim 1, wherein the peripheral circuit comprises:

a source line driver suitable for applying the erase voltage to the source line;

a page buffer group suitable for controlling the bit lines of the selected memory block to be floated in the period; and a row decoder suitable for floating the first and second select lines and applying the first and second erase permission voltages, in the period.

7. The memory device of claim 1, wherein the control circuit controls the peripheral circuit further to:

perform an erase verify operation after the period, increase, when a result of the erase verify operation indicates fail of the erase operation, a potential level of the erase voltage according to an Increment Step Pulse Erase (ISPE) scheme, and perform the erase operation again with the increased erase voltage.

8. An operating method of a memory device which includes a memory cell array including a plurality of memory blocks each having a plurality of memory cells and a plurality of word lines arranged between a first select line and a second select line, the operating method comprising an erase step of performing an erase operation during a period by applying an erase voltage to a source line or a drain line of a memory block selected among the plurality of memory blocks and then by floating the first and second select lines to precharge a channel of a cell string within the selected memory block, wherein the erase step includes:

sequentially selecting one of the plurality of word lines from a word line closest to the first select line to a word line farthest from the first and second select lines;

concurrently selecting one of the plurality of word lines from a word line closest to the second select line to the word line farthest from the first and second select lines; and applying a first erase permission voltage to the selected word lines while applying a second erase permission voltage to remaining word lines except the selected word lines among the plurality of word lines, and wherein the first erase permission voltage has a lower potential level than the second erase permission voltage.

9. The operating method of claim 8, further comprising applying, after the sequentially selecting, the concurrently selecting and the applying for all of the plurality of word lines as the selected word lines, the second erase permission voltage to all of the word lines until the period ends.

10. The operating method of claim 8, further comprising repeating the sequentially selecting, the concurrently selecting and the applying until the period ends.

11. The operating method of claim 8, wherein the second erase permission voltage has a ground voltage level and the first erase permission voltage has a negative level lower than the ground voltage level.

12. The operating method of claim 8, wherein the plurality of word lines include a first dummy word line closest to the first select line, a second dummy word line closest to the second select line and a third dummy word line farthest from the first and second select lines.

13. A method of erasing a nonvolatile memory block coupled to a source line, first and second select lines and word lines arranged between the first and second select lines, the method comprising:

applying an erase voltage to the source line and then floating the first and second select lines to precharge a channel of a cell string within the block;

performing sequential iterations to erase the block; and verifying whether the erasing of the block is of success, wherein the sequential iterations include applying a first erase permission voltage to the individual word lines sequentially from an outermost word line to an innermost word line with respect to the first and second select lines while applying to remaining ones of the word lines a second erase permission voltage higher than the first erase permission voltage.

14. The method of claim 13, further comprising applying, between the performing and the verifying, the second erase permission voltage to the word lines.

15. The method of claim 13, further comprising repeating, when the erasing of the block is verified as failed, the applying, the performing and the verifying by raising the erase voltage.

* * * * *